(12) United States Patent
Hayashi (10) Patent No.: US 8,712,600 B2
(45) Date of Patent: Apr. 29, 2014

(54) TRAVELING VEHICLE SYSTEM AND SELF-DIAGNOSIS METHOD FOR THE TRAVELING VEHICLE SYSTEM

(75) Inventor: Takao Hayashi, Inuyama (JP)

(73) Assignee: Murata Machinery Ltd. (JP)

(*) Notice: Subject to any disclaimer, the term of this patent is extended or adjusted under 35 U.S.C. 154(b) by 58 days.

(21) Appl. No.: 13/080,259

(22) Filed: Apr. 5, 2011

(65) Prior Publication Data
US 2011/0251735 A1 Oct. 13, 2011

(30) Foreign Application Priority Data

Apr. 7, 2010 (JP) ................................ 2010-088457

(51) Int. Cl.
*G06F 7/00* (2006.01)
*G05D 1/02* (2006.01)

(52) U.S. Cl.
CPC ............ *G05D 1/0212* (2013.01); *G05D 1/0214* (2013.01); *G06F 7/00* (2013.01)
USPC ............... 701/2; 701/31.4; 701/33.4; 701/37; 701/117; 701/420; 707/705

(58) Field of Classification Search
CPC ....... G05D 1/0212; G05D 1/0214; G06F 7/00
USPC ......... 701/2, 33.4, 36, 53, 117, 420, 31.4, 37; 726/28; 705/4, 305; 370/401; 340/540, 340/988, 426.11, 426.25, 459; 318/561
See application file for complete search history.

(56) References Cited

U.S. PATENT DOCUMENTS

| | | | | |
|---|---|---|---|---|
| 4,034,369 A | * | 7/1977 | Tanigawa et al. | 340/459 |
| 4,977,359 A | * | 12/1990 | Sawai et al. | 318/561 |
| 5,239,471 A | * | 8/1993 | Takahashi | 701/37 |
| 5,420,794 A | * | 5/1995 | James | 701/117 |
| 5,745,030 A | * | 4/1998 | Aaron | 340/426.11 |
| 6,028,537 A | * | 2/2000 | Suman et al. | 340/988 |
| 6,100,792 A | * | 8/2000 | Ogino et al. | 340/426.25 |
| 6,148,256 A | * | 11/2000 | Graf et al. | 701/53 |
| 6,259,990 B1 | * | 7/2001 | Shojima et al. | 701/420 |

(Continued)

FOREIGN PATENT DOCUMENTS

| | | | |
|---|---|---|---|
| EP | 1727011 A1 | 11/2006 | |
| JP | 2006331110 | * 5/2005 | ............... G05D 1/02 |

(Continued)

OTHER PUBLICATIONS

European Search Report from App. No. EP 11160789.1 dated Mar. 21, 2012 (7 pages).

(Continued)

*Primary Examiner* — Tuan C. To
*Assistant Examiner* — Yuri Kan
(74) *Attorney, Agent, or Firm* — Fish & Richardson P.C.

(57) ABSTRACT

Self-diagnosis of a system including a travel route and a plurality of traveling vehicles traveling along the travel route in accordance with instructions from a ground controller is performed. The ground controller provides an instruction to the traveling vehicle regarding a position designated for performing detection using an abnormal condition detection sensor based on an absolute coordinate for uniquely identifying a position on the travel route. The traveling vehicle performs detection at the designated position using the abnormal condition detection sensor, and reports detection data including a detection position and detection time to the ground controller.

19 Claims, 6 Drawing Sheets

(56) References Cited

U.S. PATENT DOCUMENTS

| | | |
|---|---|---|
| 8,140,358 B1 * | 3/2012 | Ling et al. .................. 705/4 |
| 8,495,046 B1 * | 7/2013 | Buchanan et al. ............ 707/705 |
| 2001/0037168 A1 * | 11/2001 | Hozuka et al. .................. 701/29 |
| 2003/0040885 A1 * | 2/2003 | Schoess et al. ............... 702/173 |
| 2004/0036601 A1 * | 2/2004 | Obradovich .................. 340/540 |
| 2005/0065682 A1 * | 3/2005 | Kapadia et al. ................ 701/35 |
| 2005/0216153 A1 * | 9/2005 | Cho ............................. 701/35 |
| 2006/0155439 A1 * | 7/2006 | Slawinski et al. .............. 701/35 |
| 2008/0147306 A1 * | 6/2008 | Hayashi ........................ 701/117 |
| 2008/0219274 A1 * | 9/2008 | Kato et al. .................... 370/401 |
| 2008/0244757 A1 * | 10/2008 | Nakagaki ....................... 726/28 |
| 2009/0106036 A1 * | 4/2009 | Tamura et al. ................. 705/1 |
| 2011/0178657 A1 | 7/2011 | Harasaki |
| 2011/0251735 A1 * | 10/2011 | Hayashi ......................... 701/2 |
| 2012/0116633 A1 * | 5/2012 | Kato et al. ..................... 701/36 |

FOREIGN PATENT DOCUMENTS

| | | | |
|---|---|---|---|
| JP | 2006331110 A * | 5/2005 | ............ G05D 1/02 |
| JP | 2006-331110 | 2/2006 | |
| JP | 2006-331110 | 12/2006 | |
| JP | 2008-13153 | 1/2008 | |
| JP | 4117625 | 5/2008 | |
| WO | WO 2010/035411 A1 | 4/2010 | |

OTHER PUBLICATIONS

Office Action from Japanese Application No. 2010-088457 dated Jan. 31, 2012, and English translation thereof (5 pages).

\* cited by examiner

TRAVELING VEHICLE SYSTEM AND SELF-DIAGNOSIS METHOD FOR THE TRAVELING VEHICLE SYSTEM

CLAIM OF PRIORITY

This application claims priority under the Paris Convention and/or under 35 U.S.C. 119 (a)-(d) to Japanese Application Number 2010-088457, filed on Apr. 7, 2010, the entire contents of which are hereby incorporated by reference.

FIELD OF THE INVENTION

The present invention relates to self-diagnosis of a traveling vehicle system.

BACKGROUND

Systems for transporting articles such as FOUPs using traveling vehicles such as overhead traveling vehicles are used in semiconductor factories or the like. In such a system, it is required to maintain the high utilization ratio of the entire system. For this purpose, it is required to not only simply transport articles but also provide preventive maintenance for the traveling vehicles of the system and equipment on the ground such as travel rails. In this specification, equipment provided on the ground such as travel rails, equipment associated with the travel rails such as non-contact power feeder line, load ports, buffers as temporal storages of the articles are referred to as the "infrastructure" of the traveling vehicle system.

With regard to self-diagnosis of the traveling vehicle system, according to the disclosure of Patent Publication 1 (JP4117625C), occurrence of abnormal vibrations or the like is reported from a traveling vehicle to a system controller.

If any abnormal condition occurs again in another traveling vehicle at the same position on the travel rail, it is determined that the abnormal condition is caused on the infrastructure side. If any abnormal condition occurs again in the same traveling vehicle at another position on the travel rail, it is determined that the abnormal condition is caused on the traveling vehicle side. The inventor studied to perform self-diagnosis of the system more properly for making it possible to provide preventive maintenance, and arrived at the present invention.

SUMMARY OF THE INVENTION

An object of the present invention is to perform self-diagnosis of a traveling vehicle system more properly to prevent occurrence of troubles.

The present invention relates to a traveling vehicle system including a travel route and a plurality of traveling vehicles traveling along the travel route. Each of the traveling vehicles is equipped with an abnormal condition detection sensor for reporting an abnormal condition to a ground controller when the abnormal condition is detected. The ground controller includes a designation unit configured to provide instructions for the traveling vehicles of positions for performing detection with the abnormal condition detection sensors in the traveling vehicles based on an absolute coordinates for uniquely identifying the positions on the travel route. The traveling vehicles include reporting units configured to detect the abnormal condition at the designated positions with the abnormal condition detection sensors and report detection data including the detection positions and detection times to the ground controller.

Further, the present invention relates to a self-diagnosis method for a traveling vehicle system including a travel route and a plurality of traveling vehicles traveling along the travel route. Each of the traveling vehicles is equipped with an abnormal condition detection sensor for reporting an abnormal condition to a ground controller when the abnormal condition is detected. The method includes the steps of providing an instruction from the ground controller to the traveling vehicles of positions designated for performing detection with the abnormal condition detection sensors based on absolute coordinates for uniquely identifying positions on the travel route, and performing detection at the designated positions with the abnormal condition detection sensors in the traveling vehicles, and reporting detection data including the detection positions and detection times to the ground controller.

In this specification, description regarding the traveling vehicle system is directly applicable to the self-diagnosis method for the traveling vehicle system, conversely, and description regarding the self-diagnosis method for the traveling vehicle system is directly applicable to description regarding the traveling vehicle system.

In the present invention, since the position for performing detection can be designated finely, conditions of the traveling vehicle and the travel route can be detected accurately. Therefore, maintenance for the traveling vehicle or the travel route can be performed before any trouble occurs actually, and preventive maintenance is performed.

Preferably, the ground controller is configured to provide instructions for the traveling vehicles of target positions in each predetermined control cycle, and designate positions for performing detection during communication of instructing the target positions. The traveling vehicles are configured to carry out velocity control in each control cycle to arrive at the target positions, and perform detection at the designated positions. In this manner, since the position for performing detection is included in the data at the time of transmitting the instruction of the target position, communication does not become complicated. Further, in the system where the target position is instructed from the ground controller, bad influences may be caused by the troubles in the traveling vehicle and the troubles on the travel route. Therefore, by providing preventive maintenance for the system, the high throughput of the system can be maintained.

Further, preferably, a storage unit configured to store the detection data from the sensor is provided in the ground controller. The detection data is associated with at least velocities and accelerations of the traveling vehicles. Since the meaning of the detection data depends on the velocity and acceleration of the traveling vehicle, by associating the sensor data with these items of data, and storing the sensor data, accurate analysis is achieved.

Preferably, the traveling vehicles have abnormal condition detection sensors for detecting an abnormal condition related to traveling and abnormal condition detection sensors for detecting an abnormal condition related to transfer. The ground controller is configured to designate a joint between travel rails on the travel route, a diverging point, and a merging point, and a curve segment as positions for performing detection with the abnormal condition detection sensors for detecting the abnormal condition related to traveling, and designate positions for transferring articles between a transfer apparatus of the traveling vehicle and transfer equipment as positions for performing detection with the abnormal condition detection sensors for detecting the abnormal condition related to transfer. In this manner, in respect of traveling and transfer, the condition can be detected by finely designating the position for performing detection. In particular, the condition of a step or the like that is present at the joint between the travel rails can be detected correctly.

Particularly preferably, the ground controller has an identification unit configured to identify positions requiring maintenance on the travel route and traveling vehicles requiring maintenance based on the detection data from a plurality of traveling vehicles at the same position or the detection data from the same traveling vehicle at a plurality of positions. When any abnormal condition or any sign of a possible abnormal condition is found, it is determined that whether the abnormal condition may occur again at the same position on the travel route or may occur again in the same traveling vehicle. Based on the determination, whether the cause of the possible abnormal condition is present in the travel route or the traveling vehicle can be further determined. Thus, the position on the travel route that requires maintenance or the traveling vehicle that requires maintenance can be identified.

More preferably, the ground controller includes a time series analysis unit for performing time series analysis of the detection data. By the time series analysis, it becomes possible to detect the sign of the possible abnormal condition. Therefore, preventive maintenance can be performed more reliably.

Preferably, the traveling vehicles include vibration sensors and sound volume sensors as the abnormal condition detection sensors, and a frequency analyzing unit for performing frequency analysis of data from the vibration sensors and data from the sound volume sensors is provided in the traveling vehicle or the ground controller. By the frequency analysis, it becomes possible to detect the cause of vibrations, e.g., detect whether the vibrations are caused by the travel motor, the gap in the travel route, loosening in the joint portion between the travel motor and the travel wheels, abrasion or the like. Further, by the frequency analysis of the sound volume sensor, the above determination can be made more reliably based on the frequency of noises.

Preferably, the ground controller has a traveling vehicle analysis unit for analyzing a condition of the traveling vehicles based on the detection data from the abnormal condition detection sensors and an infrastructure analysis unit for analyzing a condition on the travel route based on the detection data from the abnormal condition detection sensors. Each of the traveling vehicle analysis unit and the infrastructure analysis unit includes an instantaneous value analysis unit for analyzing the abnormal condition based on an instantaneous value of the detection data, and a time series analysis unit for performing time series analysis of the detection data, and a group analysis unit for analyzing the detection data of all of the traveling vehicles or the detection data of the entire travel route. By the instantaneous value analysis, the abnormal condition and the sign before the possible abnormal condition can be detected. Further, by the time series analysis, the sign can be detected at the earlier stage. Further, by the group analysis, the condition of the entire system can be analyzed.

DETAILED DESCRIPTION

Hereinafter, an embodiment in the most preferred form for carrying out the present invention will be described. The scope of the invention shall be determined according to understanding of a person skilled in the art based on the description of the claims in consideration of the description of the specification and techniques known in this technical field.

Figure 1:
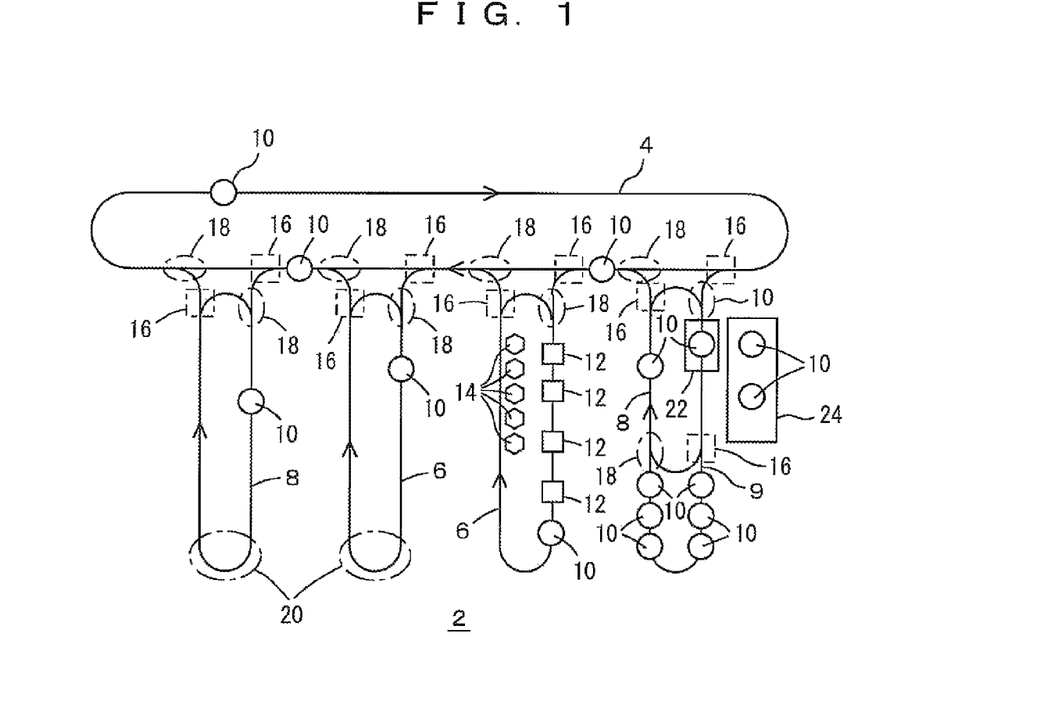
FIG. 1 is a diagram showing a layout of a traveling vehicle system according to an embodiment.

FIGS. 1 to 9 show a traveling vehicle system 2 according to the embodiment. In FIG. 1, a reference numeral 4 denotes inter-bay route, reference numerals 6 denote intra-bay routes, and reference numerals 8 denote maintenance routes. The maintenance routes 8 are partially used as parking routes 9. Reference numerals 10 denote traveling vehicles. Though overhead traveling vehicles are adopted in the embodiment, the traveling vehicles 10 are not limited to the overhead traveling vehicles, and other types of traveling vehicles may be used as well. The maintenance routes 8 may not be dedicated routes. Parts of inter-bay routes 6 may be used as the maintenance routes 8. The routes 4 to 9 make up a travel route of the overhead traveling vehicles 10. For example, a large number of load ports 12 are provided along the intra-bay routes 6 for transfer of FOUPs between the load ports 12 and semiconductor processing equipment (not shown). Further, a large number of buffers 14 are provided along the intra-bay routes 6 and the inter-bay route 4 for temporarily storing the FOUPs in the buffers 14. In addition to straight segments, the travel route includes diverging points 16, merging points 18, and curve segments 20. The traveling vehicles 10 tend to be vibrated in these portions. The travel route is formed by connecting a plurality of travel rails, and the traveling vehicles 10 tend to be vibrated at joints between the travel rails. In FIG. 1, only some of the load ports 12, the buffers 14, the diverging points 16, the merging points 18, and curve segments 20 are shown.

The maintenance route 8 is a route used for maintenance of the traveling vehicle 10, and used as a waiting space. A reference numeral 22 denotes a lifter for elevating and lowering the traveling vehicles 10 between the ground and the travel rails. Maintenance operation is performed in a working area 24 provided on the ground. Further, when the traveling vehicle 10 travels in the maintenance route 8, for example, vibrations at the time of traveling, occurrence of noises, and electrical current consumed in each motor, accuracy in the travel stop position and the transfer position or the like are detected. In order to collect data for detection of abnormal conditions of the traveling vehicles 10 and infrastructure, the data for detection of abnormal conditions is collected over the entire areas of the intra-bay routes 6 and the inter-bay route 4. In the maintenance route 8, data for detection of abnormal conditions of the traveling vehicle 10 can be collected based on traveling, transfer or the like of the traveling vehicle 10. The maintenance routes 8 may not be provided.

Figure 2:
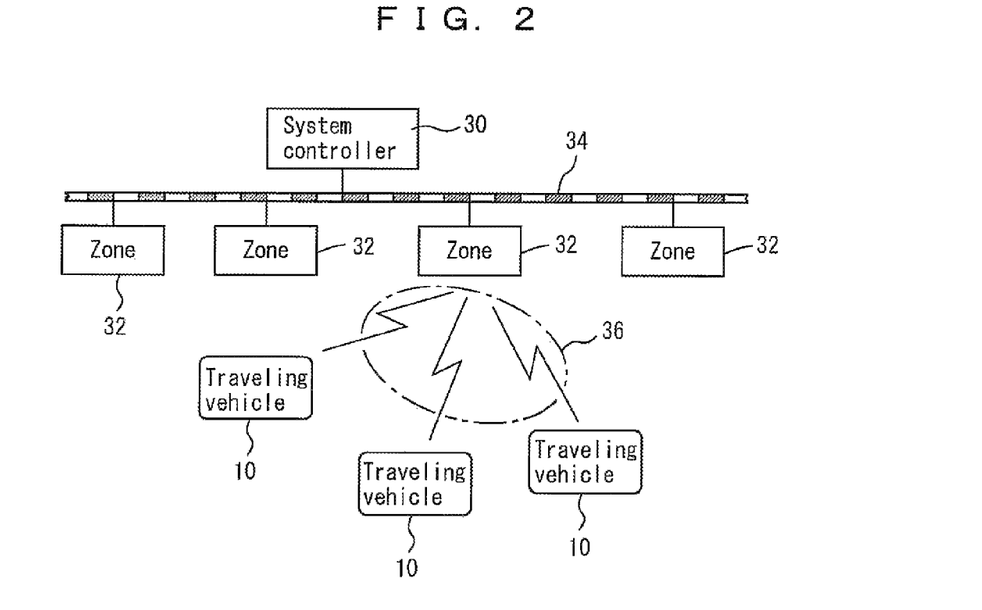
FIG. 2 is a diagram showing communication channels between a system controller and traveling vehicles according to the embodiment.

As shown in FIG. 2, the system controller 30 controls the overall operation of the overhead traveling vehicle system 2. A plurality of zone controllers 32 are connected to the ground LAN 34. A zone is allocated to each of the zone controllers 32. The zone controller 32 communicates with traveling vehicles 10 in its zone for controlling the traveling vehicles 10. The zone controller 32 may not be provided. For example, the system controller 30 may directly communicate with the traveling vehicles 10 for directly controlling the entire area of the traveling vehicle system 2.

Figure 3:
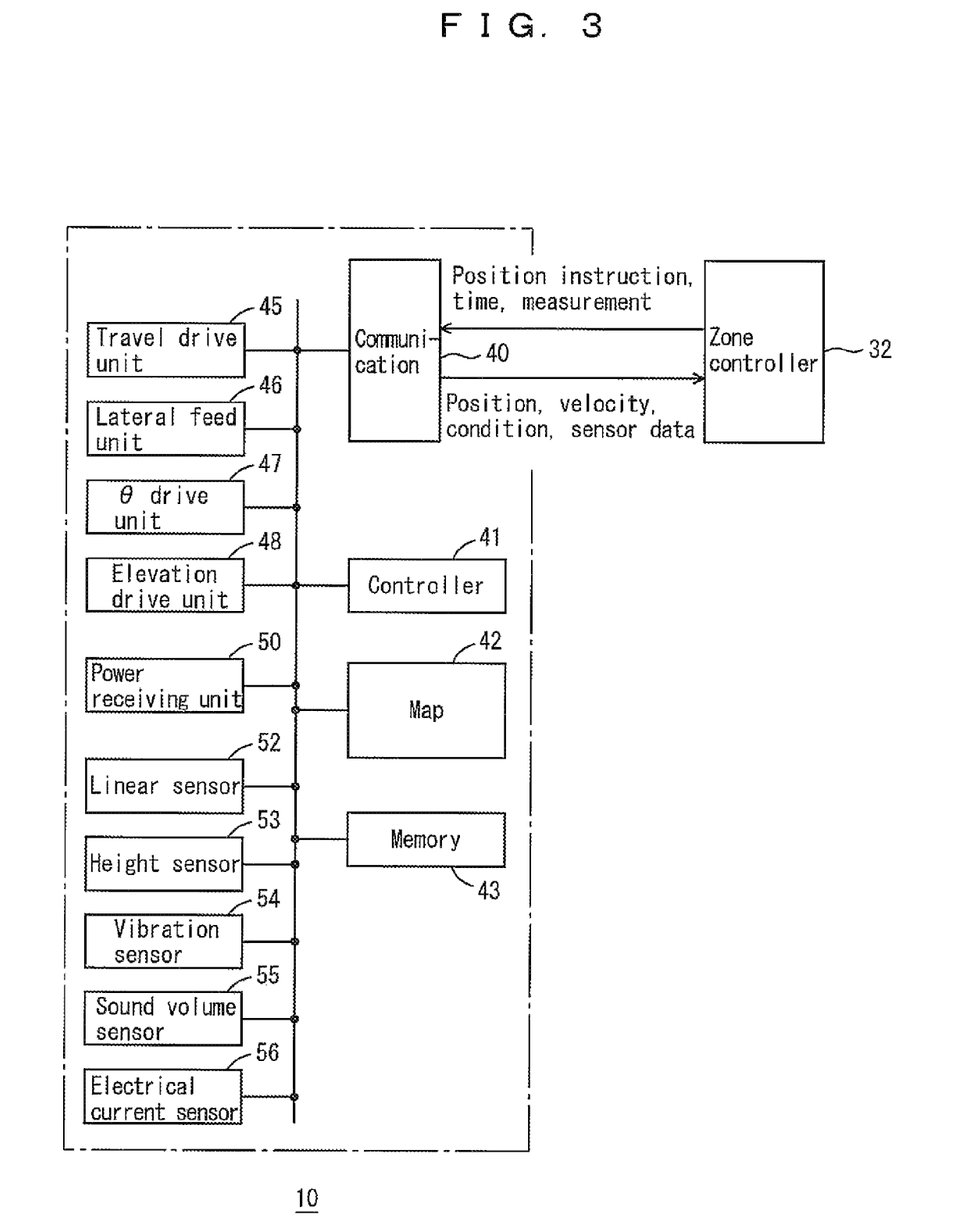
FIG. 3 is a diagram showing structure of the traveling vehicle and data communicated with a zone controller according to the embodiment.

FIG. 3 shows structure of the traveling vehicle 10 and communication with the zone controller 32. When the zone controller 32 is not provided, the system controller 30 directly communicates with the traveling vehicle 10. The traveling vehicle 10 is equipped with a communication unit 40 for communicating its own position and velocity, acceleration, the presence or absence of articles currently being transported, and sensor data obtained from various sensors in each predetermined control cycle. Further, the zone controller 32 receives a positioning instruction regarding a target position in the next control cycle, items to be detected by sensors, instructions regarding transfer or the like in each predetermined control cycle. In the embodiment, the control cycle is 0.1 second, preferably, in a range of 0.01 to 1 second. One report or one instruction may be sent by one packet or a plurality of packets. The instructions regarding detection are provided during the same communication as the instructions regarding the position or the like. Further, the communication cycle between the zone controller 32 and the traveling vehicle 10 is about 0.1 second, and the clock of the traveling vehicle 10 is synchronized with the clock notified from the zone controller 32. Therefore, reporting from the overhead traveling vehicle 10 may include, or may not include the time data.

A travel drive unit 45 implements control of a travel motor (not shown). Specifically, the travel drive unit 45 controls the travel motor by generating velocity instructions for allowing the traveling vehicle to reach the target position in the next control cycle designated by the zone controller 32. A lateral feed unit 46 laterally feeds an elevation drive unit 48 and a θ drive unit 47 for transfer of articles to or transfer of articles from the buffer or the load port. The θ drive unit 47 rotates the elevation drive unit 48 about a vertical axis, e.g., for adjusting the orientation of the FOUPs. The elevation drive unit 48 has a hoisting mechanism or the like, for elevating and lowering an elevation frame supporting the FOUPs for transfer of the FOUPs to or from the buffer or the load port. Each of the drive units 45 to 48 has at least one motor, and the electrical current value of each motor is detected by an electrical current sensor 56.

A power receiving unit 50 receive electrical energy from a non-contact power feeder line provided inside the travel rails, and a linear sensor 52 detects marks such as magnets provided along the travel rails for detecting positions based on the marks. A height sensor 53 detects a height position of the elevation frame. Specifically, the height sensor 53 detects the height position based on, e.g., the number of rotations of the elevation motor of the elevation derive unit 48. A vibration sensor 54 is attached to the elevation frame to detect vibrations applied to articles during transportation of the articles. A sound volume sensor 55 detects the volume of sounds generated in the traveling vehicle 10. One sound volume sensor 55 may be provided for all of components including the travel drive unit 45. Alternatively, the sound volume sensor 55 may be provided for each of the units. Further, the electrical current sensor 56 detects electrical current energy consumed in the motor of each drive unit.

An on board controller 41 implements the overall control of the traveling vehicle 10. Data regarding the travel route is written in a map 42. For example, absolute coordinates of marks are written in the map 42. By adding data from a linear sensor 52 to the absolute position of the mark 42, the absolute coordinate on the travel route can be determined. The absolute coordinate is a coordinate that can uniquely identify a position of the travel route. For example, as shown in FIG. 1, in the case where the travel route is divided into a plurality of routes, the absolute coordinate include data indicating which route corresponds to the current position and a relative coordinate relative to a reference position in the route. A memory 43 stores various items of data generated in the traveling vehicle 10. In particular, the memory 43 stores data from sensors for detecting abnormal conditions together with the time when the data is generated, the position, velocity, and acceleration of the traveling vehicle, the presence or absence of articles, information regarding the condition such as "in the middle of transfer", "stopped", and "in the middle of traveling".

Figure 4:
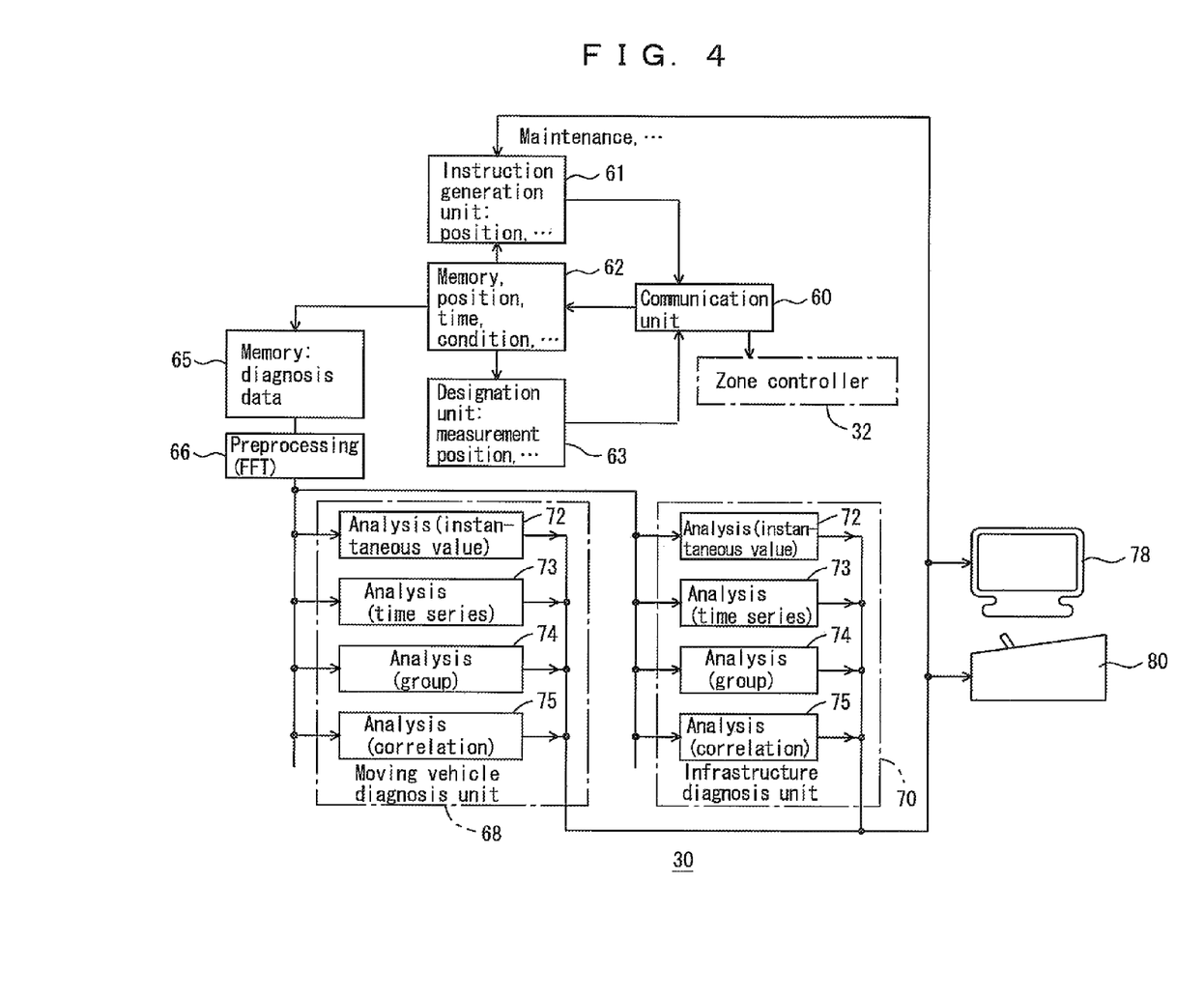
FIG. 4 is a diagram showing self-diagnosis in the system controller according to the embodiment.

FIG. 4 shows structure of the system controller 30. A reference numeral 60 denotes a communication unit for communication with the zone controller 32. The communication unit communicates with a host controller (not shown), and reports transportation results when there was a request for transportation of articles such as FOUPs. A reference numeral 61 denotes an instruction generator unit, and a reference numeral 63 denotes a designation unit for combining instructions from the units 61, 63. Instructions from the units 61, 63 are combined, and provided from the communication unit 60 to the traveling vehicle through the zone controller 32. The instruction generator unit 61 generates instructions regarding a target position in the next control cycle, a diverging direction, execution of stop and transfer, and other instructions regarding traveling and transfer. The designation unit 63 generates instructions designating detection positions and items that should be detected. The detection positions are displayed using the absolute coordinates. A memory 62 stores items of data such as the position, time, velocity, acceleration, and the condition of the traveling vehicle, and sensor data. Data for each of the traveling vehicles is obtained in each control cycle through the communication unit 60. Based on these items of data, instructions regarding traveling and transfer are generated by the instruction generator unit 61, and instructions regarding detection are generated by the designation unit 63.

Two types of instructions are combined by the communication unit 60, and the combined instructions are notified to the traveling vehicle. Thus, on the traveling vehicle side, instructions are received in each control cycle and executed in the next control cycle, and the designated detection is performed. The current position of the traveling vehicle is stored in the memory 62, and the instruction generator unit 61 designates a target position in the next control cycle. Therefore, at the time of passing the detection position in the next control cycle, detection is instructed. It is sufficient to carry out detection when a detection position and detection items are designated, and it is not necessary to carry out detection in each control cycle. When a detection positions and detection items are designated, the traveling vehicle performs detection at the designated position.

Among the data in the memory 62, data for diagnosis determined by the vibration sensor, the sound volume sensor, and the electrical current sensor are stored in the memory 65. These items of data in the memory 65 are associated with the ID of the traveling vehicle, the detection time, the detection position, velocity and acceleration at the time of detection, data indicating whether any articles are present or not. Alternatively, the detection data may be stored temporarily in the memory of the traveling vehicle, and a plurality of items of data may be communicated collectively to the system controller.

A preprocessing unit 66 is an FFT (Fast Fourier Transform) unit or the like, and Fourier Transform is applied to data related to frequency such as vibration data and/or sound volume data. Fourier Transform may be performed by the traveling vehicle, and data after Fourier Transform may be notified to the system controller. Diagnosis data is analyzed by a traveling vehicle analysis unit 68 for each of the traveling vehicles. An infrastructure analysis unit 70 analyzes the diagnosis data for equipment on the rail side such as the travel rail, the load port, or the buffer. Though the target of analysis by the analysis units 68, 70 changes depending on the traveling vehicle or the equipment on the ground, the method of analysis does not change.

An instantaneous value analysis unit 72 analyses instantaneous values of vibration data, the sound volume data, the electrical current data or the like, and classifies the instantaneous values into three types, e.g., a normal range, a caution required range, and an abnormal range. Among these ranges, for example, the caution required range is present on both of outer sides of the normal range at the center. Further, the abnormal range is present on both of outer sides of the caution required range. The thresholds of the normal, caution required, and abnormal ranges may vary depending on factors such as the velocity and acceleration of the traveling vehicle, the presence or absence of articles, and the type of detection position. That is, the thresholds of the normal, caution required, and abnormal ranges vary depending on whether the traveling vehicle is at the joint between travel rails, whether the traveling vehicle is traveling at a diverging point, the merging point or not, whether the detection position is in a curve segment or not. As for the transfer, the thresholds of the normal, caution required, and abnormal ranges vary depending on transfer to or from to the load port, transfer to or from the buffer, elevation velocity and elevation acceleration of the elevation frame, lateral feeing amount or the like. When the instantaneous value analysis unit 72 detects an abnormal condition, it requests to retry detection. For example, if the instantaneous value analysis unit 72 detects any abnormal condition, the instantaneous value analysis unit 72 requests the traveling vehicle to retry detection at the next joint between rails. Likewise, the instantaneous value analysis unit 72 requests another traveling vehicle to retry detection at the joint between the rails where the abnormal condition was detected. In this manner, whether the cause of the abnormal condition is present in the traveling vehicle or in the rails or the like is determined.

A time series analysis unit 73 predicts the future condition of the traveling vehicle and infrastructure based on time series data such as the vibration, sound volume, electrical current or the like of a plurality of traveling vehicles at the same position or the same traveling vehicle at a plurality of positions, and determines whether the future condition is ranked the normal condition, the caution required condition, or the abnormal condition. It is not essential to perform the prediction of the future condition for both of the traveling vehicle and infrastructure. Depending on the situation, the prediction of the condition of one of the traveling vehicle and infrastructure may be omitted. If the predicted condition is determined as any of the ranks of normal, caution required, and abnormal conditions, the thresholds may be changed depending on the velocity and acceleration of the traveling vehicle, and the presence or absence of articles. In the time series analysis, for example, using the time as a variable, for example, the average value and variance or the like of the detection data are determined, and these items of data are extrapolated to the future for determining prediction values. Otherwise, among these items of such distributed data, data close to the abnormal side is extrapolated into the future to determine prediction values. Further, the amount of changes in the data detected each time, i.e., the amount of change in the data between the previous detection and the present detection is determined. Based on the magnitude of the change amount, it is determined whether the condition of the rail, the condition of the traveling vehicle or the like is stable or not. If there is a chance of reaching an abnormal value within one day or within one week, the traveling vehicle is controlled to travel to the maintenance route for performing maintenance operation for the traveling vehicle. In the case where the abnormal condition is caused by equipment such as the travel rail or the buffer, use of the equipment in the abnormal condition is prohibited, and an instruction to perform maintenance operation for the equipment is provided.

A group analysis unit 74 analyses the condition of equipment on the ground such as the condition of a group of traveling vehicles or the condition of a group of travel rails. For example, the average value, dispersion, and the tendencies in the change of the data such as vibrations, noises, and motor's electrical current are determined for all of the traveling vehicles. Further, the average value, dispersion, and the tendencies in change of the data such as vibrations, noises or the like are determined in each position of the equipment on the ground such as the rails. In this manner, the condition of vehicles as a whole and the condition of the travel route as a whole are determined. By detecting these conditions, it can be determined whether there are any vehicles or positions on the travel route having values that are deviated from the average values of the vehicles or positions in the entire system, and these vehicles or the positions are determined as targets of maintenance. Thus, preventive maintenance can be performed easily. The tendencies in the operation of the traveling vehicle system after installation of the traveling vehicle system will be considered. Immediately after installation of the traveling vehicle system, initial troubles may occur. After the troubles are eliminated, troubles due to aging degradation such as abrasion of members occur. The group analysis unit 74 performs such analysis of the group to detect the condition of the system. Further, the traveling vehicles and the positions on the travel route that are deviated from the average tendencies of the group can be detected.

The correlation analysis unit 75 checks the condition of the traveling vehicle or the condition of the member on the travel route before and after an event such as the maintenance to determine how the condition of the traveling vehicle or the condition of the member on the travel route has been changed by the maintenance, and detects correlation between various items of data. The results obtained by the analysis units 72 to 75 are outputted to components such as a monitor 78 and a printer 80, and outputted to the instruction generator unit 61, e.g., as an instruction to travel to the maintenance route. The group analysis unit 74 and the correlation analysis unit 75 may not be provided.

Figure 5:
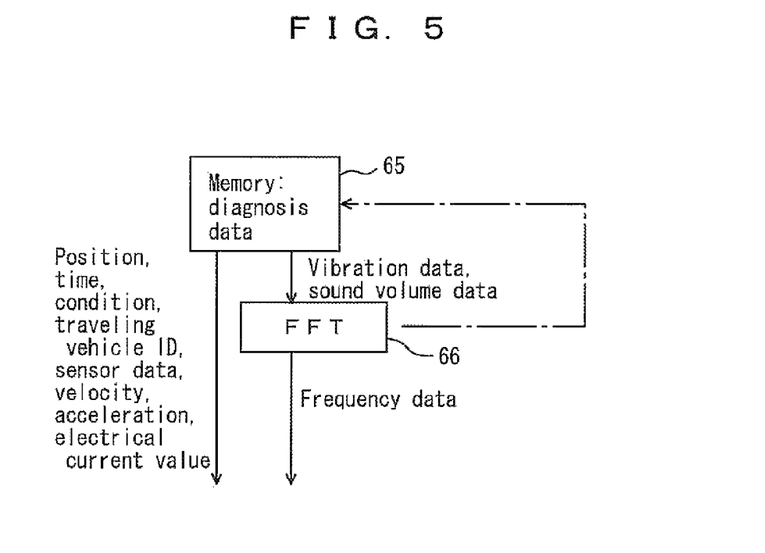
FIG. 5 is a diagram showing preprocessing by frequency analysis of diagnosis data.

FIG. 5 shows preprocessing of analysis data. Fast Fourier transform is applied to vibration data and sound volume data to generate frequency data. Based on the frequency characteristics of the vibration data or the sound volume data, the abnormal position or the cause of the abnormal condition is identified. Instead of the Fast Fourier transform, wavelet transform may be performed to develop the frequency characteristics of the vibration data, the time when signals of the vibration data and the sound volume data are generated, and the spatial transition of the signals as a result of movement of the traveling vehicle to more reliably identify the abnormal position. Further, the position where detection was performed, the time when detection was performed, the ID of the traveling vehicle, various items of sensor data, velocity, acceleration, and the electrical current value are inputted to the analysis units as diagnosis data.

Figure 6:
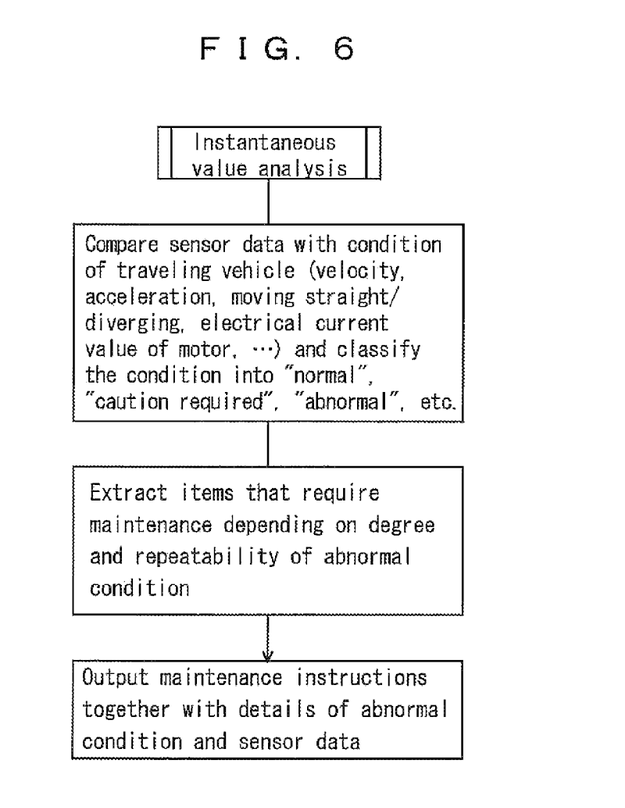
FIG. 6 is a flow chart showing instantaneous value analysis of the diagnosis data.

FIG. 6 shows contents of instantaneous value analysis. Sensor data is compared with thresholds in correspondence with the condition of the traveling vehicle to classify the condition into any of the normal condition, caution required condition, abnormal condition or the like. Depending on the degree of abnormal condition and/or depending on repeatability, e.g., whether the "caution required" level occurs repeatedly, it is determined whether maintenance is required or not, and items that require maintenance are extracted. If maintenance is required, the details of the abnormal condition, sensor data, and items that require maintenance are outputted. In this manner, since what kind of abnormal condition is present and what kind of maintenance is required can be determined, maintenance can be performed easily.

Figure 7:
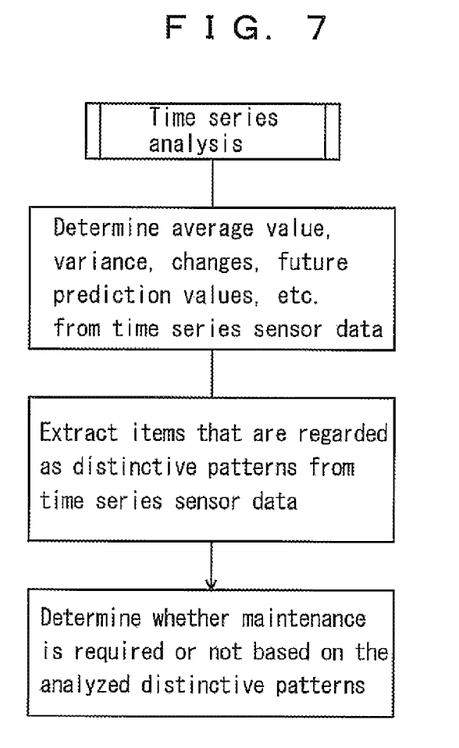
FIG. 7 is a flow chart showing time series analysis of the diagnosis data.

In the time series analysis, as shown in FIG. 7, based on the time series sensor data, prediction values regarding the future condition are determined for each traveling vehicle and each position on the travel route. Then, the items that require maintenance are extracted, and instructions for maintenance are provided together with the sensor data of the traveling vehicle or the position on the travel route that requires maintenance. Thus, preventive maintenance can be provided for the traveling vehicle and the travel route.

Figure 8:
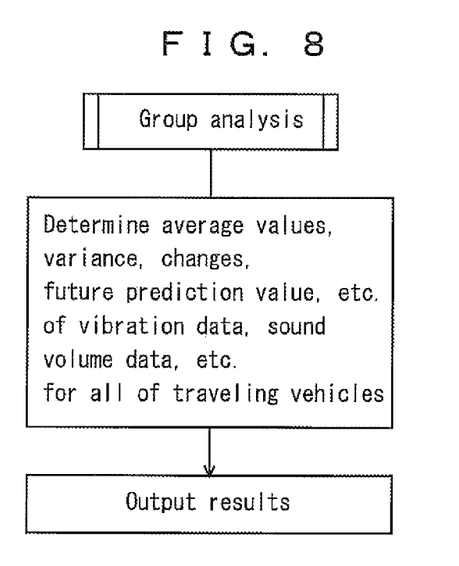
FIG. 8 is a flow chart showing group analysis of the diagnosis data.

In the group analysis, as shown in FIG. 8, vibration data, sound volume data, and the average value and variance of the electrical current value of each motor, and tendencies of the changes in these items of data are determined. The traveling vehicle and the position of on the travel route that are deviated from the average value are extracted.

Figure 9:
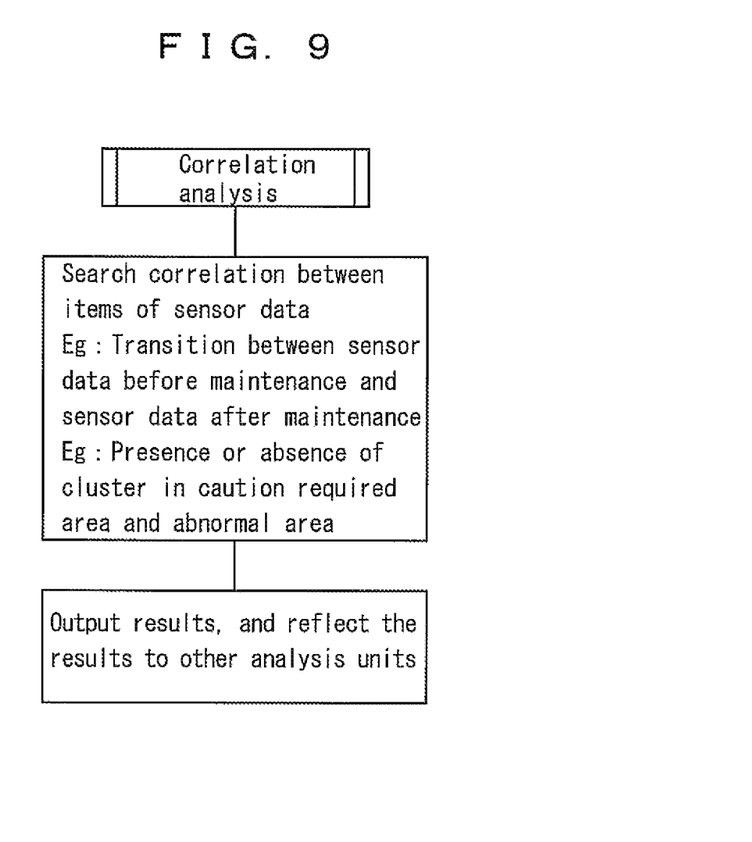
FIG. 9 is a flow chart showing correlation analysis of the diagnosis data.

In the correlation analysis shown in FIG. 9, correlation between items of sensor data is searched. For example, if maintenance is performed normally, after the maintenance, the sensor data should be stabilized. Therefore, it is checked whether the sensor data has been stabilized actually. Assuming that each of factors such as vibrations, noises, velocity, electrical current value or the like is represented by an individual dimension, sensor data obtained one time can be regarded as one point in multi-dimensional space. Cluster is an area as a collection of these points. If there is a cluster in a caution required range or an abnormal range, it indicates that troubles are caused by combination of various factors. When a result is obtained by the correlation analysis, the result is outputted and reflected to other analysis units.

In the embodiment, the following advantages are obtained.
(1) The detection position is designated by an absolute coordinate. Therefore, the detection position can be designated finely at a joint between rails or the like. Further, since detection can be performed repeatedly at the same position, it becomes possible to determine repeatability of the signal in the caution required area and the abnormal area.
(2) In a system where an instruction for designating a target position is provided from the system controller to the traveling vehicle in each control cycle, though the throughput in the system is high, significant troubles may occur. In such a system, it is particularly advantageous to provide preventive maintenance. Further, communication is performed at the same time as communication of the normal instruction.

(3) Since detection data is associated with the velocity and acceleration of the traveling vehicle, and then, stored, influence due to these factors can be corrected, and analysis can be performed objectively.
(4) Any positions such as a joint between travel rails, a diverging point, a merging point, a curve segment can be designated specifically as the detection position. In these positions, during traveling of the vehicle, the condition of the vehicle is detected. For example, vibrations, noises, electrical current value of the travel motor or the like during traveling of the vehicle are detected. At the time of transferring articles to or from a load port, a buffer, or the like, the condition during the transfer is detected. For example, vibrations applied to the elevation frame during transfer and/or noises and current values of the elevation motor or the like during transfer are detected. Depending on the detection target, detection items can be designated from the system controller. All the items of data may be requested in each detection all the time.
(5) By time series analysis of the sensor data, the future trend can be predicted. Therefore, before actual troubles occur, preventive maintenance can be performed.
(6) By frequency analysis of signals from the vibration sensor and/or signals from the sound volume sensor, it becomes possible to detect the cause of the "caution required" condition and/or the "abnormal" condition", e.g., detect the abnormal condition in the motor, the step in the travel rail, loosening in the joint portion, abrasion of the wheel or the like.
(7) By providing the instantaneous value analysis unit and the group analysis unit in each of the traveling vehicle and the travel route, an abnormal condition in the individual vehicle or the position on the travel route can be determined by the instantaneous value analysis unit for performing maintenance operation. Further, by the time series analysis unit, the future trend can be predicted, and preventive maintenance can be performed. Further, by the group analysis unit, the current situation of the system can be analyzed.
(8) Data of overall historical records such as abnormal condition detection, maintenance, restart or like of all of the traveling vehicles and infrastructure on the ground can be stored in the ground controller (system controller). These items of data can be used as maintenance data for predicting the future conditions of the traveling vehicles and infrastructure on the ground, and utilized for the trend management and product life management of the traveling vehicle system. As a result, the overall system can be kept in a normal condition advantageously.

DESCRIPTION OF THE NUMERALS

2: traveling vehicle system
4: inter-bay route
6: intra-bay route
8: maintenance route
9: parking route
10: traveling vehicle
12: load port
14: buffer
16: diverging point
18: merging point
20: curve segment
22: lifter
24: working area
30: system controller
32: zone controller
34: ground LAN
36: wireless LAN
40: communication unit 41: on board controller
42: map
43: memory
45: travel drive unit
46: lateral feed unit
47: θ drive unit
48: elevation drive unit
50: power receiving unit
52: linear sensor
53: height sensor
54: vibration sensor
55: sound volume sensor
56: electrical current sensor
60: communication unit
61: instruction generator unit 62, 65: memory
63: designation unit
66: preprocessing unit (FFT)
68: traveling vehicle analysis unit
70: infrastructure analysis unit
72: instantaneous value analysis unit
73: time series analysis unit
74: group analysis unit
75: correlation analysis unit
78: monitor
80: printer

What is claimed is:

1. A traveling vehicle system comprising:
a plurality of traveling vehicles for traveling along a travel route; and
a ground controller configured to provide instructions to at least one of the plurality of traveling vehicles, wherein the instructions specify one or more positions on the travel route for collection of data specifying a current condition of a portion of the travel route that is associated with the one or more positions;
wherein the at least one of the plurality of traveling vehicles is further configured to report, to the ground controller, the collected data that specifies the current condition of the portion of the travel route that is associated with the one or more positions; and
wherein the ground controller is further configured to perform operations comprising:
determining, based on the data specifying the current condition and data specifying previous conditions, travel route infrastructure condition values indicative of conditions of infrastructure of the portion of the travel route over multiple time periods;
determining an extrapolated travel route infrastructure condition value indicative of an extrapolation of the determined travel route infrastructure condition values to a future time;
generating, based on the extrapolated travel route infrastructure condition value, a prediction of a future condition of the portion of the travel route that is associated with the one or more positions, with the future condition pertaining to a time that is subsequent to a time in which the data is collected;
determining, by the ground controller, that the future condition of the portion of the travel route that is associated with the one or more positions is an abnormal condition; and
in response to determining that the future condition is the abnormal condition,
generating an instruction to perform a maintenance operation on the portion of the travel route that is associated with the one or more positions.

2. The traveling vehicle system of claim 1, wherein the ground controller is further configured to provide the instructions during a predetermined control cycle; and
wherein the at least one of the plurality of traveling vehicles is configured to carry out velocity control in the predetermined control cycle to arrive at the one or more positions on the travel route specified by the instructions.

3. The traveling vehicle system of claim 1, further comprising:
a storage unit configured to store the data collected, the data collected comprising data indicative of one or more of velocities and accelerations of the plurality of traveling vehicles.

4. The traveling vehicle system of claim 1,
wherein the at least one of the plurality of traveling vehicles comprises abnormal condition detection sensors for detecting an abnormal condition related to traveling and for detecting an abnormal condition related to transfer, and
wherein the one or more positions comprise one or more of a joint between travel rails on the travel route, a diverging point, a merging point, and a curve segment for collecting the data with the abnormal condition detection sensors.

5. The traveling vehicle system of claim 1, wherein generating the instruction to perform the maintenance operation:
generating an instruction to perform a maintenance operation on infrastructure that is located on the portion of the travel route that is associated with the one or more positions.

6. The traveling vehicle system of claim 1, wherein the plurality of traveling vehicles comprise vibration sensors and sound volume sensors for collection of the data;
wherein the ground controller is further configured to perform an operation comprising performing frequency analysis of the data collected from the vibration sensors and from the sound volume sensors; and
wherein generating, based on the data collected, the prediction of the future condition comprises:
generating, based on the frequency analysis performed on the data collected, the prediction of the future condition.

7. A method comprising:
providing an instruction to a traveling vehicle regarding one or more positions for collection of data along a travel route in a traveling vehicle system;
receiving, from the traveling vehicle, the data collected by the traveling vehicle at the one or more positions, with the collected data specifying a current condition of a portion of the travel route in the traveling vehicle system that is associated with the one or more positions;
determining, based on the data specifying the current condition and data specifying previous conditions, travel route infrastructure condition values indicative of conditions of infrastructure of the portion of the travel route over multiple time periods;
determining, by a processing device, an extrapolated travel route infrastructure condition value indicative of an extrapolation of the determined travel route infrastructure condition values to a future time;
generating, by the processing device based on the extrapolated travel route infrastructure condition value, a prediction of a future condition of the portion of the travel route in the traveling vehicle system, with the future condition occurring at a time that is subsequent to a time in which the data is collected;

determining that the future condition is an abnormal condition; and in response to determining that the future condition is the abnormal condition, generating an instruction for performance of a maintenance operation on the portion of the travel route that is associated with the one or more positions.

8. The method of claim 7, wherein providing the instruction comprises:

providing the instruction during a predetermined control cycle.

9. The method of claim 7, further comprising:

storing the data collected, the data collected comprising data indicative of one or more of a velocity and an acceleration of the traveling vehicle.

10. The method of claim 7, wherein the one or more positions comprises at least one of a joint between travel rails on a travel route in the traveling vehicle system, a diverging point, a merging point, and a curve segment.

11. The method of claim 7, wherein generating the instruction to perform the maintenance operation comprises:

generating an instruction to perform a maintenance operation on infrastructure that is located on the portion of the travel route that is associated with the one or more positions.

12. The method of claim 7, further comprising:

performing time series analysis of the data specifying the current condition and data specifying previous conditions;

wherein determining the travel route infrastructure condition values indicative of the conditions of the portion of the travel route over multiple time periods comprises:

determining, based on the time series analysis performed, the travel route infrastructure condition values indicative of the conditions of the portion of the travel route over the multiple time periods.

13. The method of claim 7, further comprising:

performing frequency analysis on the data collected;

wherein generating, based on the data collected, the prediction of the future condition comprises:

generating, based on the frequency analysis performed on the data collected, the prediction of the future condition.

14. One or more computer-readable storage devices storing instructions that are executable to cause one or more computers in a traveling vehicle system to perform operations comprising:

providing an instruction to a traveling vehicle regarding one or more positions for collection of data along a travel route in the traveling vehicle system;

receiving, from the traveling vehicle, the data collected by the traveling vehicle at the one or more positions, with the collected data specifying a current condition of a portion of the travel route in the traveling vehicle system that is associated with the one or more positions;

determining, based on the data specifying the current condition and data specifying previous conditions, travel route infrastructure condition values indicative of conditions of infrastructure of the portion of the travel route over multiple time periods;

determining an extrapolated travel route infrastructure condition value indicative of an extrapolation of the determined travel route infrastructure condition values to a future time;

generating, based on the extrapolated travel route infrastructure condition value, a prediction of a future condition of the portion of the travel route in the traveling vehicle system, with the future condition occurring at a time that is subsequent to a time in which the data is collected;

determining that the future condition is an abnormal condition; and in response to determining that the future condition is the abnormal condition, generating an instruction for performance of a maintenance operation on the portion of the travel route that is associated with the one or more positions.

15. The one or more computer-readable storage devices of claim 14, wherein providing the instruction comprises:

providing the instruction during a predetermined control cycle.

16. The one or more computer-readable storage devices of claim 14, wherein the operations further comprise:

storing the data collected, the data collected comprising data indicative of one or more of a velocity and an acceleration of the traveling vehicle.

17. The one or more computer-readable storage devices of claim 14, wherein the one or more positions comprises at least one of a joint between travel rails on a travel route in the traveling vehicle system, a diverging point, a merging point, and a curve segment.

18. The one or more computer-readable storage devices of claim 14, wherein generating the instruction to perform the maintenance operation comprises:

generating an instruction to perform a maintenance operation on infrastructure that is located on the portion of the travel route that is associated with the one or more positions.

19. The one or more computer-readable storage devices of claim 14, wherein the operations further comprise:

performing time series analysis of the data specifying the current condition and data specifying previous conditions;

wherein determining the travel route infrastructure condition values indicative of the conditions of the portion of the travel route over multiple time periods comprises:

determining, based on the time series analysis performed, the travel route infrastructure condition values indicative of the conditions of the portion of the travel route over the multiple time periods.

* * * * *